(12) United States Patent
Zi et al.

(10) Patent No.: US 10,698,317 B2
(45) Date of Patent: Jun. 30, 2020

(54) UNDERLAYER MATERIAL FOR PHOTORESIST

(71) Applicant: Taiwan Semiconductor Manufacturing Co., Ltd., Hsin-Chu (TW)

(72) Inventors: An-Ren Zi, Hsinchu (TW); Wei-Han Lai, New Taipei (TW); Ching-Yu Chang, Yilang County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/903,796

(22) Filed: Feb. 23, 2018

(65) Prior Publication Data
US 2019/0265590 A1 Aug. 29, 2019

(51) Int. Cl.
| | |
|---|---|
| G03F 7/20 | (2006.01) |
| G03F 7/16 | (2006.01) |
| G03F 7/09 | (2006.01) |
| G03F 7/075 | (2006.01) |
| G03F 7/11 | (2006.01) |
| G03F 7/095 | (2006.01) |
| H01L 21/033 | (2006.01) |
| H01L 21/027 | (2006.01) |

(52) U.S. Cl.
CPC ............ *G03F 7/2022* (2013.01); *G03F 7/091* (2013.01); *G03F 7/162* (2013.01); *G03F 7/203* (2013.01); *G03F 7/0752* (2013.01); *G03F 7/094* (2013.01); *G03F 7/095* (2013.01); *G03F 7/11* (2013.01); *G03F 7/2041* (2013.01); *H01L 21/0274* (2013.01); *H01L 21/0332* (2013.01); *H01L 21/0335* (2013.01); *H01L 21/0337* (2013.01)

(58) Field of Classification Search
CPC ........ G03F 7/2022; G03F 7/203; G03F 7/162; G03F 7/095; G03F 7/11; G03F 7/0752; G03F 7/094; G03F 7/2041; G03F 7/0025; G03F 7/0046; H01L 21/0332; H01L 21/0274; H01L 21/0337; H01L 21/0335
See application file for complete search history.

(56) References Cited

U.S. PATENT DOCUMENTS 5,368,901 A * 11/1994 Leuschner .............. G03F 7/038
    427/379
5,372,914 A * 12/1994 Naito .................... G03F 7/0045
    430/270.1

(Continued)

*Primary Examiner* — Cynthia Hamilton
(74) *Attorney, Agent, or Firm* — Haynes and Boone, LLP

(57) ABSTRACT

A method includes providing a layered structure on a substrate, the layered structure including a bottom layer formed over the substrate, a hard mask layer formed over the bottom layer, a material layer formed over the hard mask layer, and a photoresist layer formed over the material layer, exposing the photoresist layer to a radiation source, developing the photoresist layer, where the developing removes portions of the photoresist layer and the material layer in a single step without substantially removing portions of the hard mask layer, and etching the hard mask layer using the photoresist layer as an etch mask. The material layer may include acidic moieties and/or acid-generating molecules. The material layer may also include photo-sensitive moieties and crosslinking agents.

20 Claims, 6 Drawing Sheets

(56) References Cited

U.S. PATENT DOCUMENTS

| | | | |
|---|---|---|---|
| 6,309,955 B1 * | 10/2001 | Subramanian | H01L 21/76808 257/E21.577 |
| 7,175,944 B2 * | 2/2007 | Yin | G03F 7/11 430/14 |
| 8,609,889 B2 | 12/2013 | Ohashi et al. | |
| 8,796,666 B1 | 8/2014 | Huang et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 2001/0036748 A1 * | 11/2001 | Rutter, Jr. | H01L 21/0274 438/745 |
| 2002/0198333 A1 * | 12/2002 | Puligadda | G03F 7/091 525/533 |
| 2004/0087164 A1 * | 5/2004 | Bao | H01L 21/31144 438/694 |
| 2006/0089000 A1 * | 4/2006 | Della Guardia | C09K 13/08 438/692 |
| 2006/0094204 A1 * | 5/2006 | Isono | G03F 7/091 438/437 |
| 2006/0110901 A1 * | 5/2006 | Lu | H01L 21/31144 438/597 |
| 2009/0093114 A1 * | 4/2009 | Burns | H01L 21/31144 438/637 |
| 2011/0311915 A1 * | 12/2011 | Kimura | G03F 7/0045 430/271.1 |
| 2012/0122029 A1 * | 5/2012 | Kudo | G03F 7/091 430/270.1 |
| 2014/0120469 A1 | 5/2014 | Prokopowicz | |
| 2014/0273506 A1 * | 9/2014 | Liu | C09D 5/006 438/758 |
| 2016/0372326 A1 * | 12/2016 | Zhong | C09D 131/02 |
| 2017/0125340 A1 * | 5/2017 | Tsai | H01L 21/02071 |
| 2019/0080960 A1 * | 3/2019 | Ho | H01L 21/76843 |

* cited by examiner

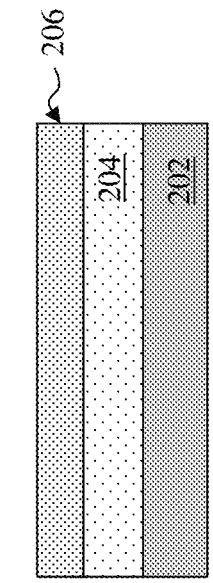
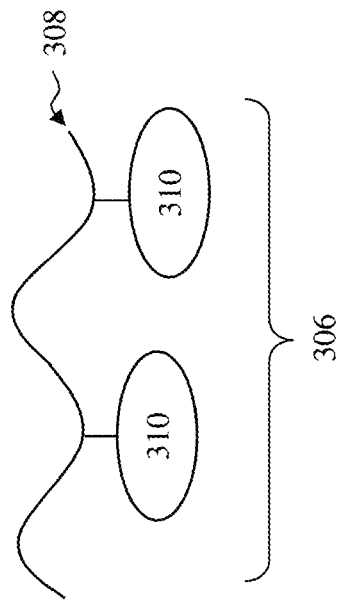
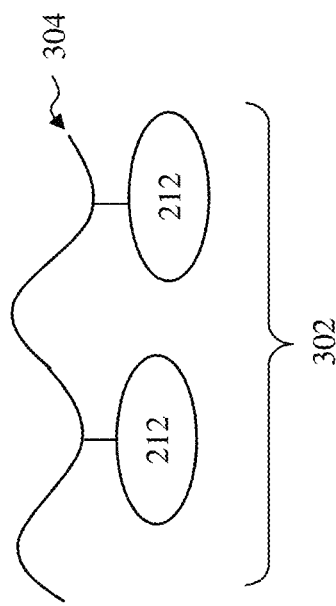

US 10,698,317 B2

UNDERLAYER MATERIAL FOR PHOTORESIST

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

In one exemplary aspect, photolithography is a process used in semiconductor micro-fabrication to selectively remove parts of a thin film or a substrate. The process uses light to transfer a pattern (e.g., a geometric pattern) from a photomask to a light-sensitive layer (e.g., a photoresist layer) on the substrate. The light causes a chemical change (e.g., increasing or decreasing solubility) in exposed regions of the light-sensitive layer. Baking processes may be performed before and/or after exposing the substrate, such as in a pre-exposure and/or a post-exposure baking process. A developing process then selectively removes the exposed or unexposed regions with a developer solution forming an exposure pattern in the substrate. Finally, a process is implemented to remove (or strip) the remaining photoresist from the underlying material layer(s), which may be subjected to addition circuit fabrication steps. For a complex IC device, a substrate may undergo multiple photolithographic patterning processes.

Structures and compositions of photoresist materials have been modified in order to accommodate complex patterning processes for devices with decreased sizes. Though such modifications have been generally beneficial, they have not been entirely satisfactory. For these reasons and others, additional improvements are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-3 and 8A-14 are fragmentary cross-sectional views of an exemplary workpiece at intermediate steps of an exemplary method according to various aspects of the present disclosure.

FIGS. 4-7 are schematic representations of exemplary chemical structures according to various aspects of the present disclosure.

DETAILED DESCRIPTION

Figure 1A:
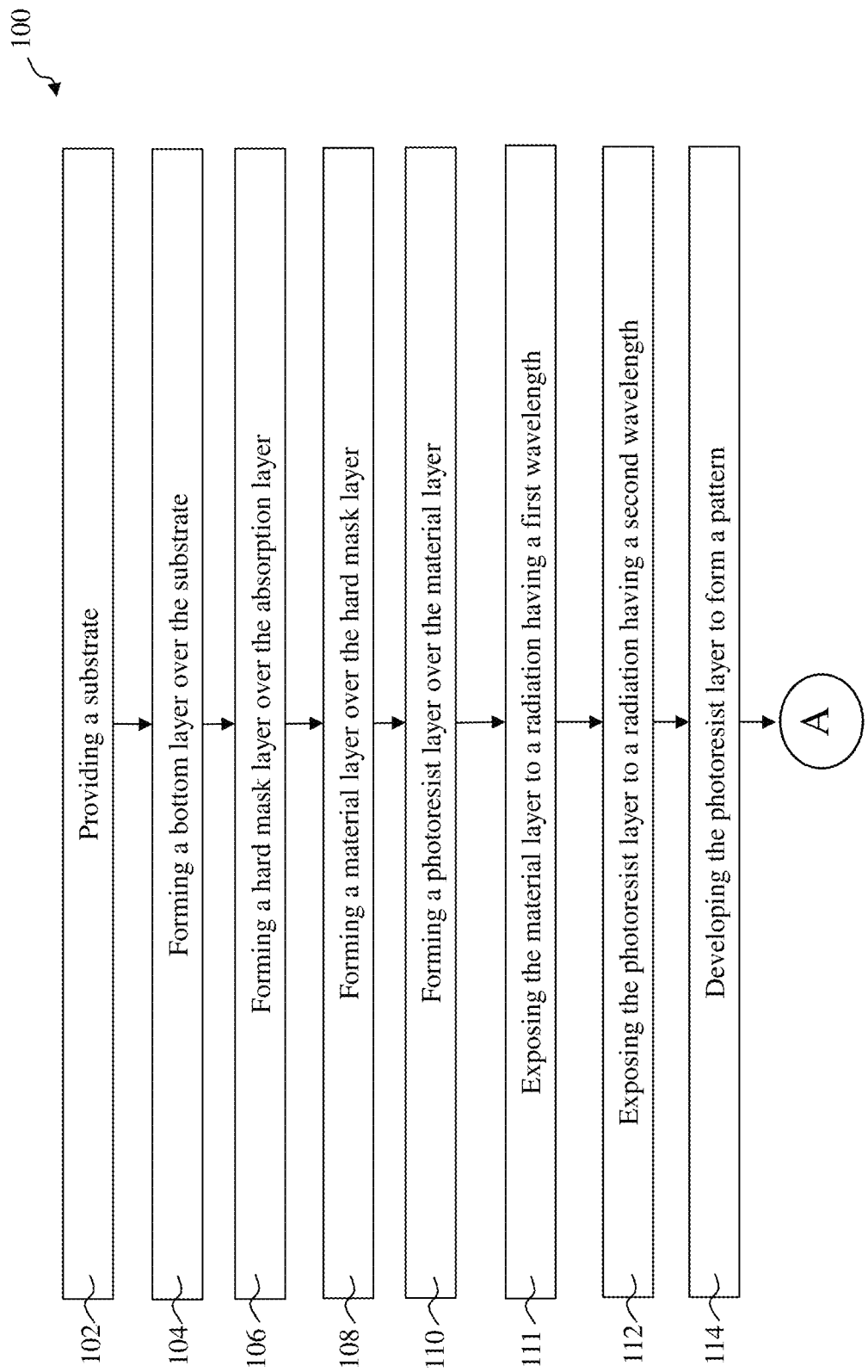
FIGS. 1A-1B illustrate a flowchart of an exemplary method according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure relates generally to IC device manufacturing and, more particularly, to device patterning processes using a multi-layer (e.g., a tri-layer) structure. The tri-layer structure may include a photoresist layer, a middle layer (e.g., a hard mask layer), and a bottom layer (e.g., bottom anti-reflective coating, or BARC) formed on a substrate has demonstrated advantages in minimizing substrate reflectivity of a light (e.g., radiation) source and increasing etching selectivity between the bottom layer and the hard mask layer. However, improvements in the tri-layer structure for advanced patterning processes are still desired. For example, it has been observed that formation of the hard mask layer (e.g., by chemical vapor deposition, or CVD) may introduce chemical moieties that can alter solubility of the photoresist layer during developing process, leading to formation of defects and scums in the resulting pattern. As demonstrated by embodiments below, incorporating an additional thin film between the photoresist layer and the hard mask layer serves to remedy these and other adverse effects, thus improving the quality of the photoresist layer during the lithography patterning process. Furthermore, the thin film contemplated in the present disclosure also provides benefits such as improved adhesion between the photoresist layer and the hard mask.

Figure 1B:
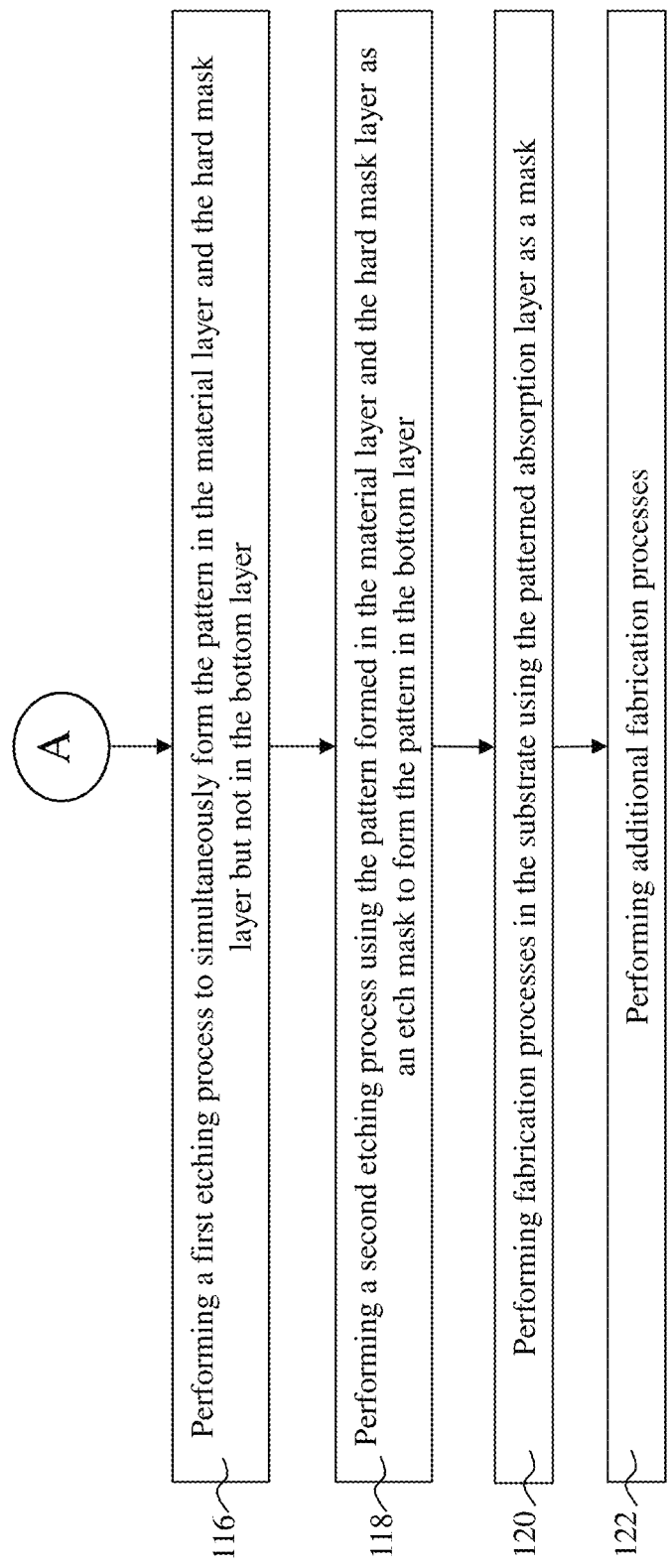

FIGS. 1A-1B illustrate a flowchart of a method 100 for patterning a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the process. Intermediate steps of the method 100 are described with reference to cross-sectional views of the workpiece 200 as shown in FIGS. 2-3 and 8-14, while schematic representations of exemplary chemical structures are shown in FIGS. 4-7. For clarity and ease of explanation, some elements of the figures have been simplified.

Referring to block 102 of FIG. 1A and to FIG. 2, a workpiece 200 including a substrate 202 is provided (or received) for patterning. The substrate 202 may comprise an elementary (single element) semiconductor, such as silicon and/or germanium; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be a single-layer material having a uniform composition; alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In other example, the substrate 202 may include a conductive layer, a semiconductor layer, a dielectric layer, other layers, and/or combinations thereof.

The substrate 202 may include various circuit features formed thereon including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof.

In some embodiments where the substrate 202 includes FETs, various doped regions, such as source/drain regions, are formed on the substrate 202. The doped regions may be doped with p-type dopants, such as phosphorus or arsenic, and/or n-type dopants, such as boron or $BF_2$, depending on design requirements. The doped regions may be planar or non-planar (e.g., in a fin-like FET device) and may be formed directly on the substrate 202, in a P-well structure, in an N-well structure, in a dual-well structure, or using a raised structure. Doped regions may be formed by implantation of dopant atoms, in-situ doped epitaxial growth, and/or other suitable techniques.

Referring to block 104 of FIG. 1A and to FIG. 2, a bottom layer 204 is formed on the substrate 202. In many embodiments, the bottom layer 204 is a bottom anti-reflective coating (BARC) whose composition is chosen to minimize reflectivity of the light source implemented during exposure of a subsequently-formed photoresist layer (e.g., photoresist layer 214 in FIG. 8A) formed over the bottom layer 204. The bottom layer 204 may be formed by spin-coating amorphous carbon onto a top surface of the substrate 202 (or a top surface of the topmost material layer of a multi-layer substrate 202) and subsequently baked for curing.

Referring to block 106 of FIG. 1A and still to FIG. 2, a hard mask layer 206 is formed over the bottom layer 204. The hard mask layer 206 may be a single-layer structure or may include a number of layers, each of which may include a dielectric, a metal, a metal compound, and/or other suitable material. In many embodiments, the hard mask layer 206 comprises a dielectric material such as a semiconductor oxide, a semiconductor nitride, a semiconductor oxynitride, and/or a semiconductor carbide material. In an exemplary embodiment, the hard mask layer 206 comprises silicon carbide, silicon nitride, silicon oxycarbide, silicon oxynitride, or other suitable dielectric materials. The composition of the hard mask layer 206 is chosen such that the hard mask layer 206 can be selectively etched without substantially etching the bottom layer 204. In other words, the hard mask layer 206 and the bottom layer 204 comprise materials having distinct etching sensitivities towards a given etchant. The hard mask layer 206 may be formed by any suitable process including chemical vapor deposition (CVD), low-pressure CVD (LPCVD), plasma-enhanced CVD (PECVD), physical vapor deposition (PVD), atomic layer deposition (ALD), spin-on coating, and/or other suitable techniques, and may be formed to any suitable thickness.

In the depicted embodiment, the hard mask layer 206 is formed by depositing a dielectric material as described above by a CVD process. Specifically, the deposition process utilizes a precursor material comprising a combination of the following elements: silicon, nitrogen, carbon, hydrogen, oxygen, and other suitable elements. In an exemplary embodiment, the precursor material comprises $SiH_2N_2$ ($C_xH_y$). During the deposition process the precursor material may produce basic moieties 208 as reaction by-products, which subsequently remain in the hard mask layer 206. Non-limiting examples of the basic moieties include amines (e.g., —$NH_2$, —NHR, or combination thereof), sulfonium amines (e.g., —$SO_2NH_2$, —$SO_2NHR$, or combination thereof), alkalines (e.g., NaOH, KOH, $Ca(OH)_2$, $Mg(OH)_2$, or combinations thereof), —$CONH_2$, —CONHR, —$CSNH_2$, —C=$CNH_2$, —C=CNHR, pyridine-$NH_2$, phenyl-$NH_2$, pyrrole-$NH_2$, thiophene-$NH_2$, or other suitable basic moieties, where R represents an alkyl, an aryl, a substituted alkyl, a substituted aryl, a heteroaromatic ring, a heteroatom, a cyclic group, or a substituted cyclic group. In many embodiments, the basic moieties 208 outgas during the deposition of the hard mask layer 206 and accumulate at a top surface of the hard mask layer 206.

Referring to block 108 of FIG. 1A and to FIG. 3, a material layer (e.g., a coating or a film) 210 is formed over the hard mask layer 206. In many embodiments, the material layer 210 comprises one or more polymeric materials and has a thickness between about 30% and about 70% of a thickness of the hard mask layer 206. In many embodiments, the material layer 210 has a thickness between about 10% and about 35% of the thickness of the bottom layer 204. In an exemplary embodiment, the thickness of the material layer 210 is between about 40 angstrom to about 250 angstrom. A solution of the material layer 210 (e.g., dissolved in one or a mixture of solvents) may be spin-coated over the hard mask layer 206. In an exemplary embodiment, the solution of the material layer 210 employed for the spin-coating process at block 108 has a lower viscosity than a solution of the bottom layer 204 employed for the spin-coating process at block 104.

Figure 8A:
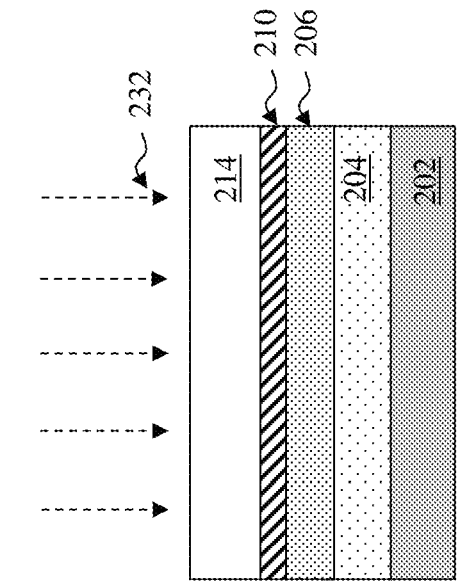

Referring to FIG. 4, the material layer 210 includes a polymer 302 having a backbone 304. The backbone 304 may comprise one of an acrylate-based polymer, a poly(norbornene)-co-maleic anhydride (COMA) polymer, a poly (hydroxystyrene) (PHS) polymer, other suitable polymers, or combinations thereof. In an exemplary embodiment, the backbone 304 includes poly(methyl methacrylate) (PMMA). In some embodiments, at least one functional group 212 is attached to the backbone 304. The functional group 212 may be an acidic moiety and may include at least one of a carboxylic acid (Formula I) or a benzoic acid (Formula II) whose chemical structures are depicted below. In another example, the functional group 212 may include a sulfonic acid group (not shown). In an exemplary embodiment, the functional group 212 neutralizes the basic moieties 208 of the hard mask layer 206 prior to forming the photoresist layer 214 (FIG. 8A). Alternatively or additionally, the polymer 302 includes other functional groups (e.g., photosensitizers) bonded to the backbone 304 including, for example, benzene, phenol, other suitable functional groups, and/or combinations thereof.

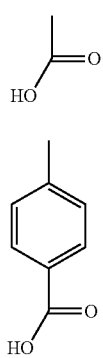

I

II

The polymer 302 may comprise repeating units of one or more of the following structures as illustrated below, where R1 comprises 3 to 15 carbon atoms forming an alkyl group, cycloalkyl group, hydroxyalkyl group, alkoxy group, alkoxyl alkyl group, or other suitable functional groups. In many embodiments, repeating units of the polymer 302 are cleavable upon a subsequent exposure and/or baking process. Advantageously, inclusion of the R1 groups depicted herein may contribute to improved adhesion between the material layer 210 and the subsequently formed photoresist layer 214 by increasing a contact angle of the photoresist material on the material layer 210.

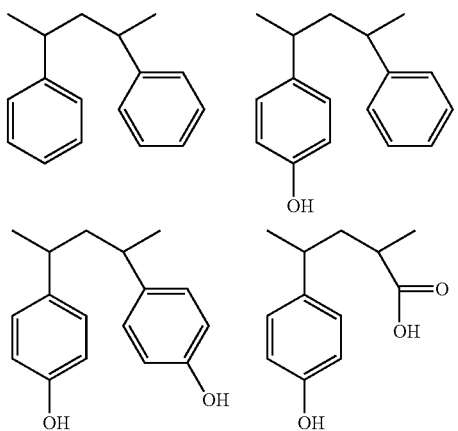

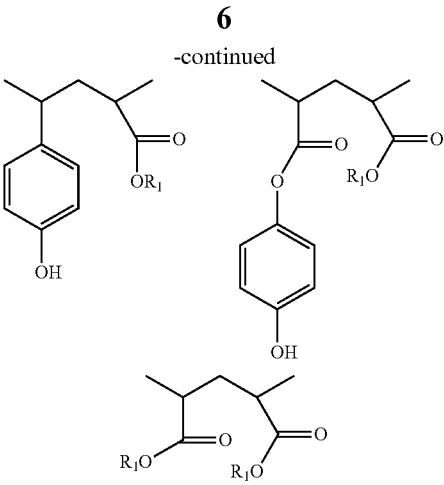

In addition to the polymer 302, referring to FIG. 5, the material layer 210 may include a polymer 306 having a backbone 308 and a functional group 310 bonded thereto. The backbone 308 may be similar to or different from the backbone 304 of the polymer 302 as discussed above. The functional group 310 may be any suitable group and may include a lactone functional group such as a gamma-butyrolactone. Two examples of lactone functional groups are illustrated below. In an exemplary embodiment, functional group 212 (FIG. 4) and functional group 310 may be bonded to the same polymer backbone (e.g., the backbone 304).

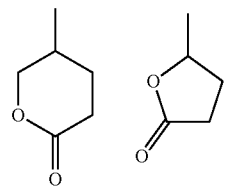

Additionally, the material layer 210 may include photobase generators (PBGs), which, as the name suggests, generates basic moieties in response to an applied radiation source. In many embodiments, the basic moieties generated by the PBGs react with the functional group 310 of the polymer 306 to produce acidic moieties similar to functional group 212 described above. Non-limiting examples of the PBGs provided herein include the following structures:

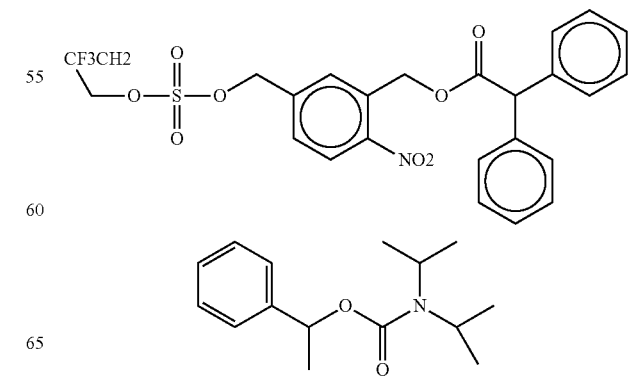

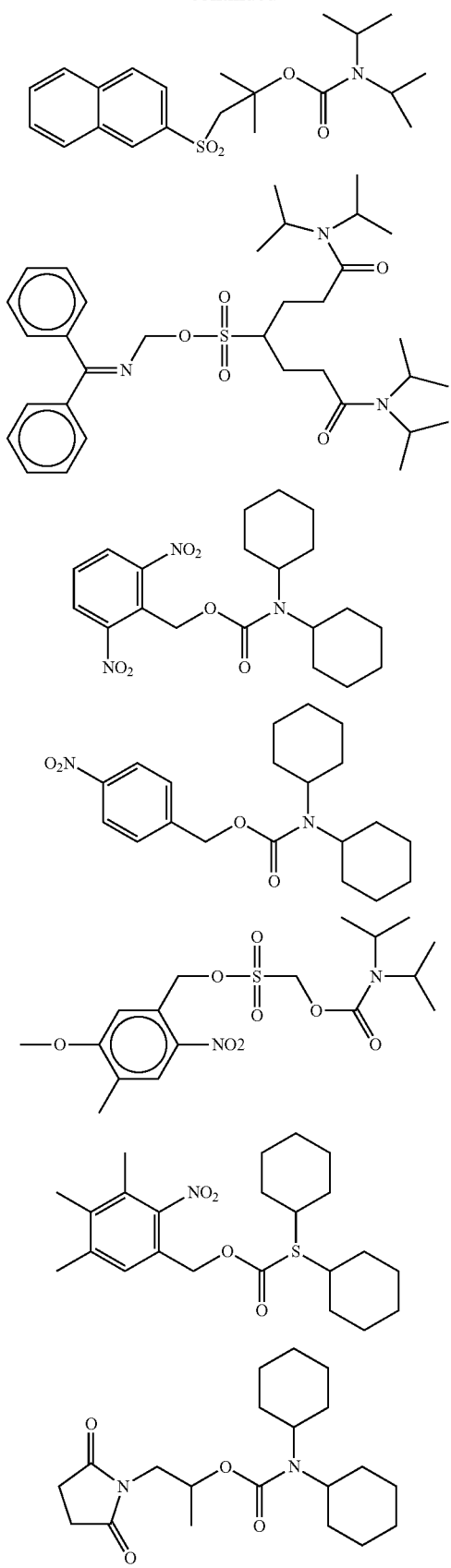

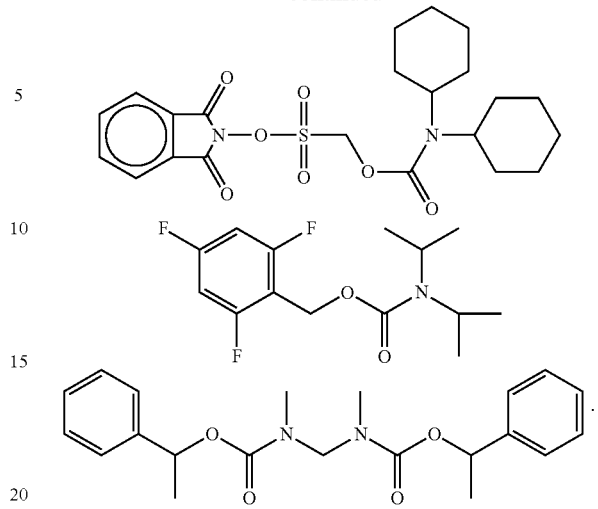

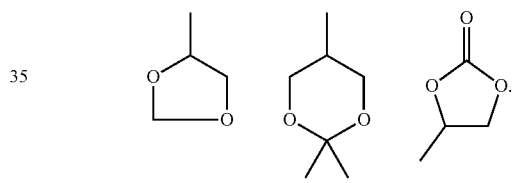

Figure 7:
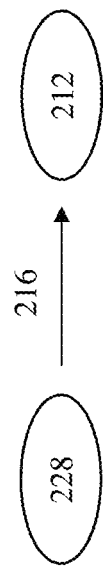
Figure 6:
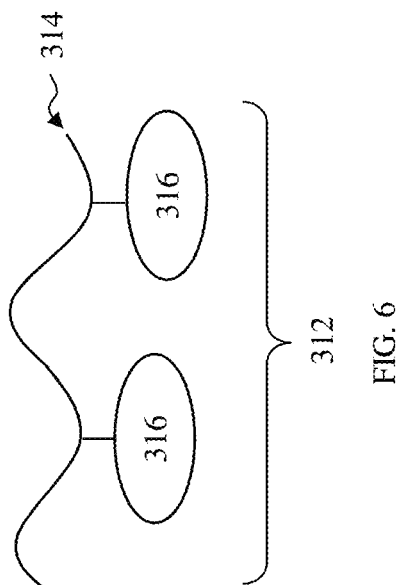
Figure 8B:
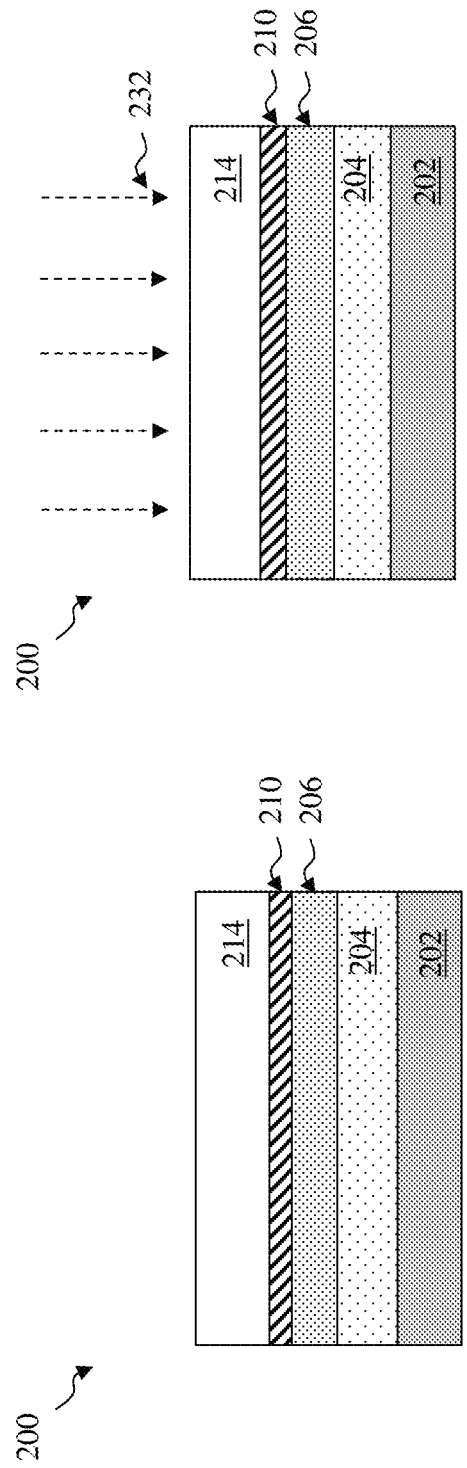

Alternatively, referring to FIG. 6, the material layer 210 may include a polymer 312 different from the polymer 306 in addition to the polymer 302. The polymer 312 includes a backbone 314 and functional group 316. The backbone 314 may be similar to or different from the backbone 304 as discussed above. The functional group 316 may be any suitable group and may include acetal, acetonide, and/or other suitable functional group as exemplified below:

In some embodiments, as depicted in FIG. 7, the material layer 210 additionally or alternatively includes one or more acid-generating molecules 228 such as photo-acid generators (PAGs) or thermal-acid generators (TAGs). The acid-generating molecules 228 differ from the polymer 302 in that they lack functional group 212 in their structures prior to undergoing an exposure process (e.g., exposure process of block 112 to be discussed below). Instead, the acid-generating molecules 228 produce functional group 212 upon being exposed to an external energy source such as radiation (e.g., a radiation source 232 as depicted in FIG. 8B to be discussed below), as in the case of a PAG, or heat, as in the case of a TAG. As such, the method 100 may include an additional step of applying a radiation and/or heat source to the material layer 210 in order to generate functional group 212 for neutralizing the basic moieties 208.

An exemplary structure of a PAG prior to exposure to radiation is illustrated by Formula III and an exemplary structure of a TAG is prior to exposure to heat is illustrated by Formula IV below. Following their respect exposure to an external energy source, the PAG may yield a structure according to Formula V and the TAG may yield a structure according to Formula VI. In the depicted examples, Ra comprises 1 to 20 carbon atoms and is a substituted or unsubstituted monovalent hydrocarbon group having an alicyclic hydrocarbon structure selected from cyclopentyl, cyclohexyl, cycloheptyl, 4-methylcyclohexyl, cyclohexylmethyl, norbornyl, adamantyl, 2-oxocyclopentyl, 2-oxocyclohexyl, 2-cyclopentyl-2-oxoethyl, 2-cyclohexyl-2-oxoethyl, 2-(4-methylcyclohexyl)-2-oxoethyl, 4-oxa-tricyclo[4.2.1.03,7]nonan-5-on-9-yl, 2-(adamantyl-1-carbonyloxy)-4-oxa-tricyclo[4.2.1.03,7]nonan-5-on-9-yl, and 4-oxoadamantyl, Rb is hydrogen or trifluoromethyl, X is a carbonyloxy (—COO—), ether, thioether, amide, or carbonate bond, and m is an integer selected between 1 and 3. As depicted in Formulas V and VI, structures of the PAG and TAG include functional group 212 such as sulfonic acid (Formula V) or carboxylic acid (Formula VI).

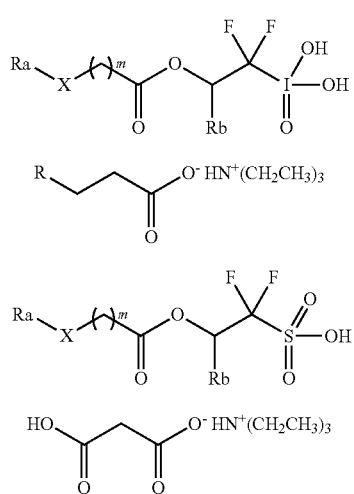

The material layer 210 may further include sensitizers aimed to increase the sensitivity of the subsequently formed photoresist layer (e.g., photoresist layer 214) to a radiation source (e.g., UV light, deep UV light, extreme UV light, etc.) implemented during an exposure process. The sensitizers may be bonded to the backbone (e.g., backbone 304, backbone 308, and/or backbone 314) of a polymer (e.g., polymer 302, polymer 306, or polymer 312) included in the material layer 210. Alternatively or additionally, the sensitizers may be blended with other components included in the material layer 210. In many embodiments, the sensitizers include a phenol, styrene, fluoride, zirconium, hafnium, tin, and/or other suitable moieties. In an exemplary embodiment, at least 30% of the functional groups attached to the polymers of the material layer 210 are phenol functional groups in order to amplify sensitivities of the PAGs in the subsequently formed photoresist layer to the radiation source. In some embodiments, between about 30% and about 70% of the functional groups attached to the polymers (e.g., polymer 302 and/or polymer 306) are phenol functional groups.

In some embodiments, the material layer 210 includes surface-active agents that improve adhesion with a photoresist layer (e.g., photoresist layer 214 discussed below). In an exemplary embodiment, a contact angle of the material layer 210 ranges between about 40 degrees and about 70 degrees.

Figure 9:
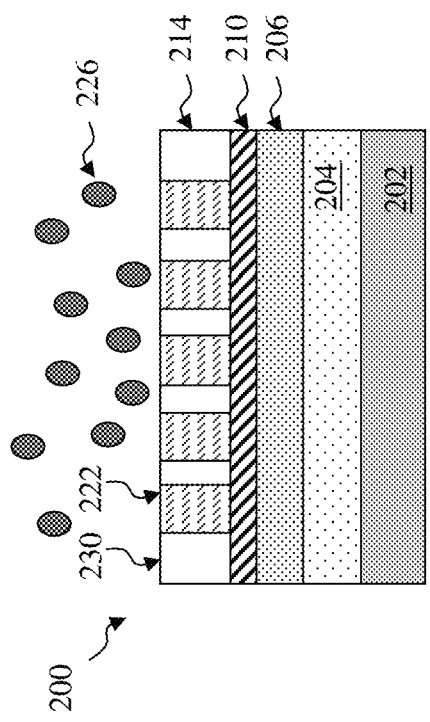

Referring to block 110 in FIG. 1A and to FIG. 8A, a photoresist layer 214 is formed over the material layer 210. The photoresist layer 214 may include any lithographically sensitive resist material, and in many embodiments, the photoresist layer 214 includes a photoresist material sensitive to a radiation source (e.g., UV light, deep ultraviolet (DUV) radiation, and/or EUV radiation as depicted in FIG. 9). However, the principles of the present disclosure apply equally to e-beam resists and other direct-write resist materials. The photoresist layer 214 may be a positive-tone or negative-tone resist material and may have a multi-layer structure. Furthermore, the photoresist layer 214 may be implemented with a chemical amplification (CA) resist material. In one embodiment, a positive-tone CA resist material includes a polymeric material (not depicted) that becomes soluble in a developer after the polymer is exposed to acidic moieties. Alternatively, a negative-tone CA resist material includes a polymeric material (not depicted) that becomes insoluble in a developer after the polymer is exposed acidic moieties.

In many embodiments, the photoresist layer 214 comprises a polymer having a backbone (not shown) with a plurality of functional groups (not shown) attached thereto. The polymer backbone may be an acrylate-based polymer or a COMA polymer, while the functional groups may include moieties that assist any subsequent exposure and developing processes. In one example, the functional groups may include lithographically sensitive groups (e.g., sensitizers) such as phenol, styrene, fluoride, and/or other suitable groups. In an exemplary embodiment, approximately between about 30% and about 40% of the functional groups attached to the backbone are phenol groups.

In many embodiments, the photoresist layer 214 includes one or more photo-acid generators (PAGs) that produce acidic moieties in response to radiation exposure. In many embodiments, the PAGs found in the photoresist layer 214 are sensitive to radiation of a different wavelength compared to the acid-generating molecules 228 of the material layer 210. In alternative embodiments, the PAGs of the photoresist layer 214 may be similar to the acid-generating molecules 228 of the material layer 210. The photoresist layer 214 may also include a photo-decomposable base (PDB) that, as the name suggests, decomposes basic moieties in response to the radiation source. In some embodiments, the PDBs have different photo-sensitivity compared to the PAGs.

The photoresist layer 214 may further include a photo-decomposable quencher (PDQ) to reduce concentration of acidic moieties in regions where chemical changes (e.g., changes in solubility) are not desired. For a positive-tone resist material, for example, these regions may include unexposed or marginally-exposed regions of the photoresist layer 214 that border exposed regions. Non-limiting examples of PDQ are illustrated below. The photoresist layer 214 may also include a number of additives such as cross-linking agents (e.g., tetramethylol glycoluril, TMGU linker, or epoxy linker), surfactant, chromophores, and/or solvents.

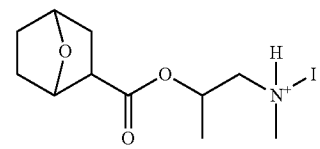

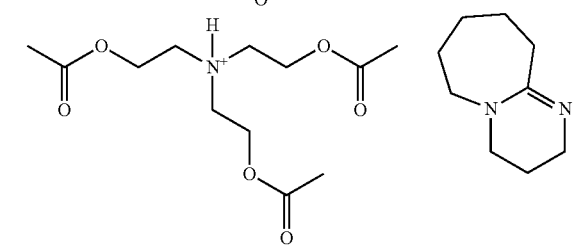

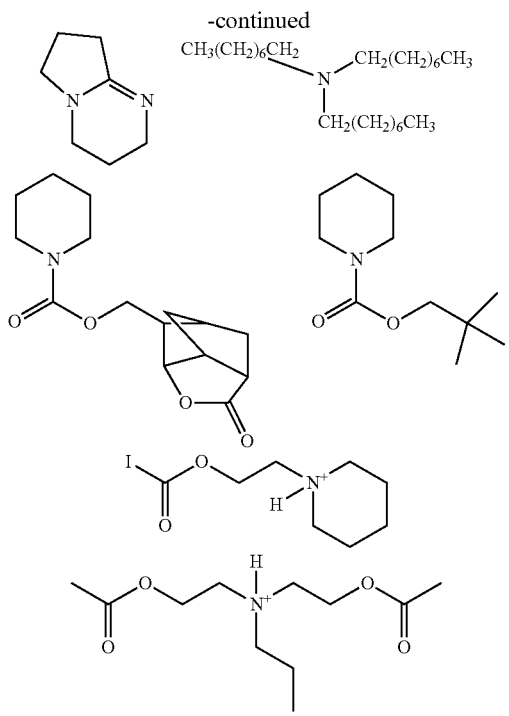

The photoresist layer 214 may be applied by any suitable technique, and in an exemplary embodiment, the photoresist layer 214 is applied in a liquid form using a spin-on (i.e., spin coating) technique. A spin coating process may use centrifugal force to disperse the photoresist layer 214 in a liquid form across a surface of an underlying substrate (e.g., the material layer 210) in a uniform thickness. To facilitate application, the photoresist layer 214 may include a solvent, which when removed, leaves the photoresist layer 214 in a solid or semisolid form (e.g., a film). The solvent may be one or more of the following: propylene glycol methyl ether acetate, propylene glycol monomethyl ether, gamma-butyrolactone, ethyl lactate, cyclohexanone, n-butyl actetate, ethyl ketone, dimethyl formamide, alcohol (e.g., isopropyl alcohol or ethanol), or other suitable solvent. The solvent may be driven off as part of the spin coating, during a settling process, and/or during a post-application/pre-exposure baking process. The pre-exposure baking process may be implemented by any suitable equipment such as, for example, a hotplate, at any temperature suitable for the particular compositions of the photoresist layer 214 and the solvent employed.

Referring to block 111 of FIG. 1A and to FIG. 8B, the material layer 210 may be exposed to a radiation source having a first wavelength 232. In an exemplary embodiment, the exposure process at block 111 is implemented in a flood exposure (i.e., without using a photomask). The exposure process at block 111 may supply energy to the acid-generating molecules 228 of the material layer 210, thereby producing functional group 212 that may subsequently neutralize the basic moieties 208 remaining in the hard mask layer 206.

Referring to block 112 of FIG. 1A and to FIG. 9, the photoresist layer 214 may be exposed to a radiation source having a second wavelength 216. In many embodiments, the radiation source having the second wavelength 216 may be an I-line (wavelength approximately 365 nm), a DUV radiation such as KrF excimer laser (wavelength approximately 248 nm) or ArF excimer laser (wavelength approximately 193 nm), a EUV radiation (wavelength between about 1 nm and about 100 nm), an x-ray, an e-beam, an ion beam, and/or other suitable radiations. The exposure process at block 112 may be performed in air, in a liquid (immersion lithography), or in vacuum (e.g., for EUV lithography and e-beam lithography). In the depicted embodiment, the second wavelength 216 is different from the first wavelength 232 implemented during the exposure process at block 111. In an exemplary embodiment, the exposure process at block 112 implements a photolithography technique using a photomask 220 that includes a pattern 218. The photomask 220 may be a transmissive mask or a reflective mask, the latter of which may further implement resolution enhancement techniques such as phase-shifting, off-axis illumination (OAI) and/or optical proximity correction (OPC). In alternative embodiments, the radiation source having the second wavelength 216 is directly modulated with a predefined pattern, such as an IC layout, without using a photomask 220 (such as using a digital pattern generator or direct-write mode). In an exemplary embodiment, the radiation source having the second wavelength 216 is a EUV radiation and the exposure process at block 112 is performed in a EUV lithography system. Correspondingly, a reflective photomask may be used to pattern the photoresist layer 214.

As depicted in FIG. 9, the exposed regions 222 of the photoresist layer 214 undergo chemical changes while unexposed regions 230 remain substantially unchanged in chemical properties. In one example, where the photoresist layer 214 includes PAGs, acidic moieties 224 that may be similar to or different form the functional group 212 (e.g., Formula V) are generated in the exposed regions 222, which in turn may alter the solubility of the photoresist material in the presence of a subsequently applied developer 226 (e.g., FIG. 10).

For a tri-layer structure without the material layer 210 in which a hard mask layer (e.g., the hard mask layer 206) is disposed between a BARC layer (e.g., the bottom layer 204) and a photoresist layer (e.g., the photoresist layer 214), the basic moieties 208 remaining in the hard mask layer 206 can diffuse into the photoresist layer 214 and inhibit the chemical transformation of the exposed regions 222 of the photoresist layer 214 by neutralizing the acidic moieties 224. Consequently, such inhibition can lead to formation of scum, which is typically insoluble (i.e., may not be readily removed) in a developer (e.g., developer 226), and may in turn cause defects in the resulting pattern formed in the photoresist layer 214, particularly near a boundary between the exposed regions 222 and the unexposed regions 230. To remedy this adverse effect, the present disclosure provides the additional material layer 210 as a barrier between the hard mask layer 206 and the photoresist layer 214 to consume the basic moieties 208 prior to or during the exposure process at block 112, thus preventing the formation of scum in the photoresist layer 214. In one example, the acid-generating molecules 228 such as PAGs and/or TAGs included in the material layer 210 produce functional group 212, which may be an acidic moiety, in response to an externally applied radiation or heat source (either at block 111 or during the exposure process at block 112), which may in turn neutralize the basic moieties 208 of the hard mask layer 206. As such, the basic moieties 208 are prevented from diffusing into the photoresist layer 214 to form defect-causing scum in the resulting pattern. In another example, the neutralization process is completed prior to the exposure processes at blocks 111 and 112 since the material layer 210 includes functional group 212 (e.g., an acidic moiety having a structure of Formula I or Formula II) as a component of the polymer 302.

Figure 10:
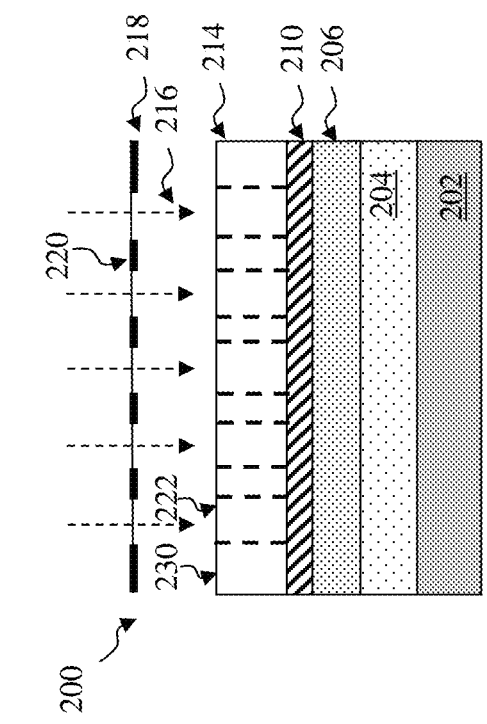

Referring to block 114 of FIG. 1A and to FIG. 10, a developing process is performed on the workpiece 200. The developing process at block 114 dissolves or otherwise removes either the exposed regions 222 in the case of a positive-tone resist development process or the unexposed regions 230 in the case of a negative-tone resist development process. The developing process at block 114 may begin with a post-exposure baking process. Depending on the polymer(s) included in the photoresist layer 214, the post-exposure baking process may catalyze a reaction between the generated acidic moieties 224 and the polymer in the photoresist layer 214. For example, the post-exposure baking process may accelerate cleaving (for positive-tone resist) or cross-linking (for negative-tone resist) of the polymer caused by the generated acid. Following the optional post-exposure baking process, a developer 226 is applied to the workpiece 200, thereby removing the particular regions (the exposed regions 222 or the unexposed regions 230) of the photoresist layer 214. Suitable positive-tone developers include tetramethyl ammonium hydroxide (TMAH), KOH, NaOH, and/or other suitable solvents, and suitable negative-tone developers include solvents such as n-butyl acetate, ethanol, hexane, benzene, toluene, and/or other suitable solvents. In the depicted embodiment, the developer 226 is a positive-tone, basic solvent such as TMAH. In many embodiments, a post-exposure bake is performed on the workpiece 200 subsequent to the developing process at block 114 to further stabilize the pattern of the photoresist layer 214.

Figure 11A:
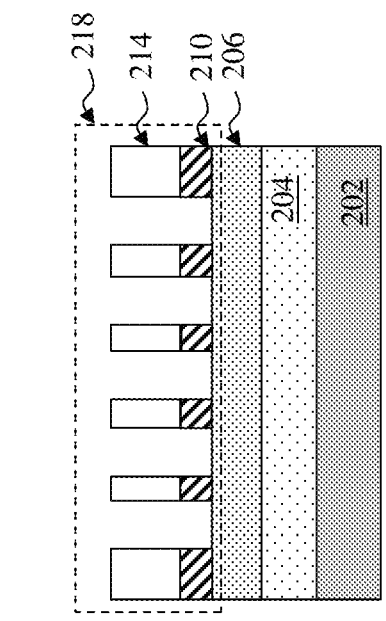
Figure 11B:
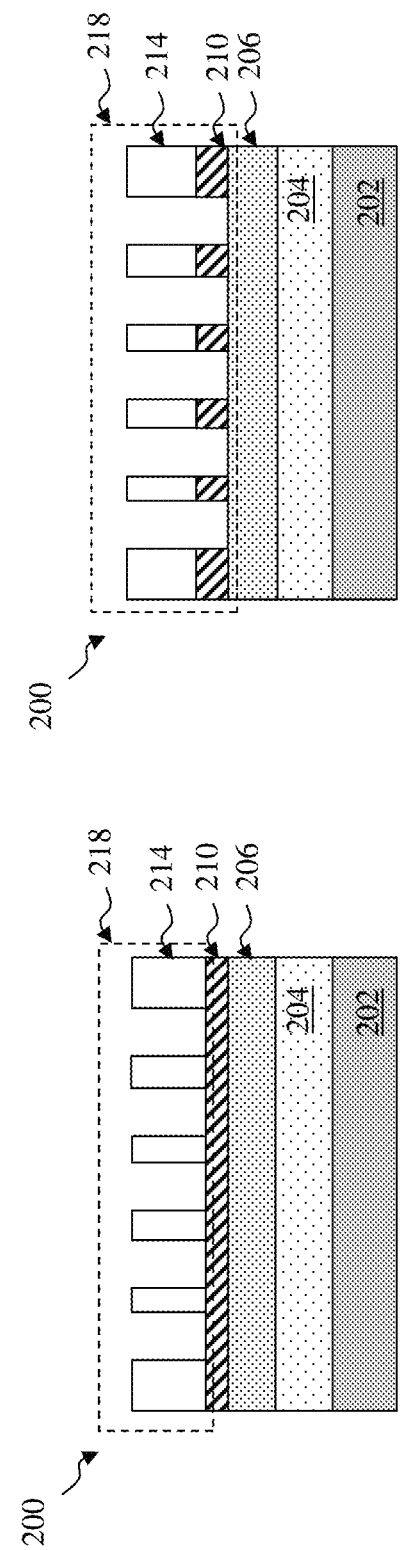

In some embodiments, as depicted in FIG. 11A, the material layer 210 remains substantially intact following the developing process at block 114. In other embodiments, as depicted in FIG. 11B, portions of the material layer 210 substantially dissolve in the developer 226 along with the exposed regions 222 of the photoresist layer 214, particularly when the developer 226 is a basic solvent such as TMAH. Additionally or alternatively, portions of the material layer 210 may be removed by a rinsing process using de-ionized (DI) water as a rinsing agent. In further embodiments, portions of the material layer 210 also dissolve in the PAGs and/or TAGs, the PBGs, the PDQs, or other components included in the photoresist layer 214, following the exposure process at block 112 and/or the developing process at block 114.

Figure 12A:
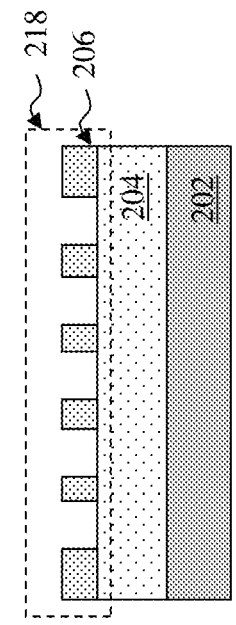
Figure 12B:
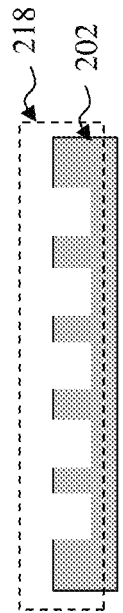

Referring to block 116 of FIG. 1B and to FIG. 12A, the photoresist layer 214 may be used as an etch mask to selectively remove portions of the material layer 210 and the hard mask layer 206 in an etching process. In the depicted embodiment, the etching process at block 116 includes etching the material layer 210 and the hard mask layer 206 in a single process. The pattern 218 formed in the photoresist layer 214 allows exposed portions of the material layer 210 and the hard mask layer 206 to be selectively etched. The photoresist layer 214 is subsequently removed from the workpiece 200 by any suitable method. Alternatively or additionally, as depicted in block 120 in FIG. 1B and FIG. 12B, the photoresist layer 214 and the material layer 210 are together used as an etch mask to selectively remove portions of the hard mask layer 206 in the etching process at block 116. As such, the etching process at block 116 substantially removes the hard mask layer 206, thereby demonstrating etching selectivity for the hard mask layer 206 over the bottom layer 204. The photoresist layer 214 and the material layer 210 are subsequently removed using any suitable method.

Due to differences in composition, the material layer 210 and the hard mask layer 206 may present distinct etching sensitivities provided that they are of comparable thickness. In the depicted embodiment, however, the material layer 210 and the hard mask layer 206 are etched in a single process using the same etchant and under the same etching conditions because the material layer 210 has a thickness that is only a between about 30% and about 70% of the thickness of the underlying hard mask layer 206. In many embodiments, the material layer 210 and the hard mask layer 206 are etched in a single process while the underlying bottom layer 204 is not substantially etched.

In some embodiments, the material layer 210 and the hard mask layer 206 are etched using any suitable method including a dry etching process, a wet etching process, other suitable etching process, a reactive ion etching (RIE) process, or combinations thereof. In an exemplary embodiment, a dry etching process is implemented and employs an etchant gas that includes a fluorine-containing etchant gas (e.g., $NF_3$, $CF_4$, $SF_6$, $CH_2F_2$, $CHF_3$, and/or $C_2F_6$), an oxygen-containing gas (e.g., $O_2$), a chlorine-containing gas (e.g., $Cl_2$, $CHCl_3$, $CCl_4$, $SiCl_4$, and/or $BCl_3$), a bromine-containing gas (e.g., HBr and/or $CHBr_3$), an iodine-containing gas, other suitable gases and/or plasmas, or combinations thereof. In an exemplary embodiment, the etching process at block 116 is implemented using a fluorine-based etchant gas for a duration of between about 4 seconds and about 30 seconds.

Figure 13:
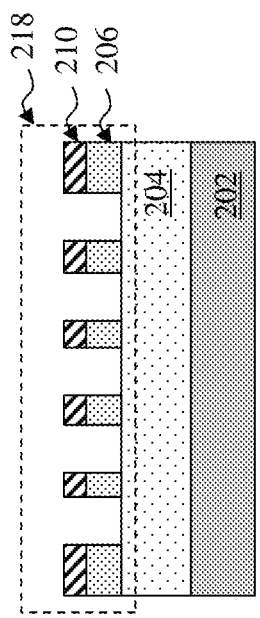

Referring to block 118 of the FIG. 1B and to FIG. 13, portions of the bottom layer 204 (i.e., the BARC layer) are selectively removed in an etching process at block 118 using the hard mask layer 206 and the material layer 210 together (FIG. 12A) or the hard mask layer 206 alone (FIG. 12B) as an etch mask. The etching process at block 118 demonstrates etching selectivity for the bottom layer 204 over the underlying substrate 202. The material layer 210 and the hard mask layer 206 are subsequently removed from the workpiece 200 by any suitable method.

In some embodiments, the bottom layer 204 is etched using any suitable method including a dry etching process, a wet etching process, other suitable etching process, an RIE process, or combinations thereof. In an exemplary embodiment, a dry etching process is implemented and employs an etchant gas that includes a fluorine-containing etchant gas (e.g., $NF_3$, $CF_4$, $SF_6$, $CH_2F_2$, $CHF_3$, and/or $C_2F_6$), an oxygen-containing gas (e.g., $O_2$), a chlorine-containing gas (e.g., $Cl_2$, $CHCl_3$, $CCl_4$, $SiCl_4$, and/or $BCl_3$), a bromine-containing gas (e.g., HBr and/or $CHBr_3$), an iodine-containing gas, other suitable gases and/or plasmas, or combinations thereof. In an exemplary embodiment, the etching process at block 118 is implemented using an oxygen-based etchant gas for a duration of between about 4 seconds and about 30 seconds.

Figure 14:
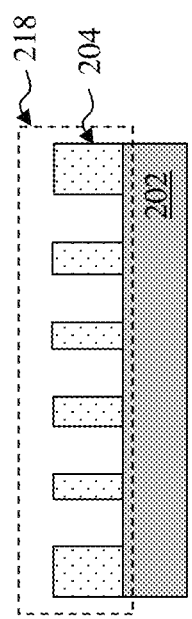

Referring to block 120 of FIG. 1B and to FIG. 14, the substrate 202 is processed using the patterned bottom layer 204 as a mask. Any suitable method may be performed to process the substrate 202 including a deposition process, an implantation process, an epitaxial growth process, and/or any other fabrication process. In an exemplary embodiment, the substrate 202 is etched using the patterned bottom layer 204 as an etch mask. In some embodiments, the substrate 202 is etched using any suitable method including a dry etching process, a wet etching process, other suitable etching process, an RIE process, or combinations thereof. However, it is understood that the concepts of the present disclosure apply to any fabrication process performed on the substrate 202. In various examples, the processed substrate 202 is used to fabricate a gate stack, to fabricate an interconnect structure, to form non-planar devices by etching to expose a fin or by epitaxially growing fin material, and/or other suitable applications. The bottom layer 204 is subsequently removed using any suitable method after the substrate 202 is processed.

Referring to block 122 of FIG. 1B, the workpiece 200 may then be provided for additional fabrication processes. For example, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOS-FET), complementary metal-oxide semiconductor (CMOS) transistors, bipolar junction transistors (BJT), laterally diffused MOS (LDMOS) transistors, high power MOS transistors, other types of transistors, and/or other circuit elements.

Although not intended to be limiting, one or more embodiments of the present disclosure provide many benefits to a semiconductor device and a formation process thereof. For example, embodiments of a material layer formed between a hard mask layer and a photoresist layer acts as a chemical barrier for consuming and/or removing chemical impurities produced during film-forming processes. Impurities such as basic moieties released during deposition of the hard mask layer may be neutralized prior to or during subsequent exposing and developing of the photoresist layer, thus preventing the formation of defects in the resulting pattern. Furthermore, the material layer provided herein may also improve stability of the photoresist layer with respect to its underlying layers by improving properties such as adhesion of the photoresist layer.

In one aspect, the present disclosure provides a method that includes providing a substrate, forming a hard mask layer over the substrate, forming a first material layer over the hard mask layer, forming a photoresist layer over the first material layer, exposing the photoresist layer to a radiation source according to a pattern, developing the photoresist layer, and performing a first etching process to form the pattern in the first material layer and the hard mask layer but not in the substrate. In some embodiments, forming the hard mask layer produces a basic moiety. In some embodiments, forming the first material layer produces an acid moiety that neutralizes the basic moiety produced by the forming of the hard mask layer. In some embodiments, a thickness of the first material layer is between about 30% and 70% that of the hard mask layer.

In some embodiments, the provided method further includes forming a second material layer over the substrate prior to the forming of the hard mask layer, and performing a second etching process using the pattern formed in the first material layer and the hard mask layer as an etch mask to form the pattern in the second material layer. In some embodiment, the second material layer is a bottom anti-reflective coating (BARC).

In some embodiments, the acidic moiety of the first material layer includes one of carboxylic acid or benzoic acid, and wherein the first material layer includes a polymer having the acidic moiety bonded to its backbone. In further embodiments, the polymer of the first material layer further includes a lactone group bonded to its backbone. In still further embodiments, developing of the photoresist layer removes portions of the photoresist layer and the first material layer.

In some embodiments, the provided method further includes exposing the first material layer to an energy source prior to the exposing of the photoresist layer, where the first material layer includes an acid-generating molecule responsive to the energy source.

In another aspect, the present disclosure provides a method that includes providing a layered structure on a substrate, the layered structure including a bottom layer formed over the substrate, a hard mask layer formed over the bottom layer, and a coating formed over the hard mask layer, forming a photoresist layer over the coating, exposing the photoresist layer to a radiation source, developing the photoresist layer to form a pattern, and etching the hard mask layer using the photoresist layer as an etch mask. In some embodiments, the exposing of the photoresist layer generates acidic moieties in the photoresist layer. In some embodiments, the developing also removes portions of the photoresist layer and the coating without substantially removing portions of the hard mask layer.

In some embodiments, the coating includes a polymer having one of a carboxylic acid or a benzoic acid attached to its backbone. In further embodiments, the polymer includes one of an acetal group or an acetonide group bonded to its backbone.

In some embodiments, the provided method further includes, prior to exposing of the photoresist layer, exposing the coating to an energy source, wherein the coating includes one of a photo-acid generator (PAG), a thermal-acid generator (TAG), or a photo-base generator (PBG). In further embodiments, the exposing of the coating is implemented using an energy source having a wavelength different from that of the exposing of the photoresist layer.

In yet another aspect, the present disclosure provides a method that includes forming a bottom anti-reflective coating (BARC) over a substrate, forming a hard mask layer over the BARC, forming a material layer over the hard mask layer, forming a photoresist layer over the material layer, performing a first exposure process, performing a second exposure process, developing the photoresist layer to form a patter, performing a first etching process of the material layer and the hard mask layer using the photoresist layer as an etch mask, and performing a second etching process of the BARC using the hard mask layer as an etch mask.

In some embodiments, the material layer includes a first acid-generating molecule sensitive to radiation having a first wavelength, and the photoresist layer includes a second acid-generating molecule sensitive to radiation having a second wavelength. In further embodiments, the performing of the first exposure process is implemented using radiation of the first wavelength, and the performing of the second exposure process is implemented using radiation of the second wavelength. In some embodiments, the developing of the photoresist layer removes portions of the material layer.

In some embodiments, the forming of the hard mask layer produces a basic moiety. In some embodiments, the performing of the first exposure process includes performing a flood exposure. In further embodiments, the performing of the first exposure process produces a first acid moiety in the material layer but not in the photoresist layer.

In some embodiments, the forming of the material layer is implemented by a spin-coating process. In some embodiments, a thickness of the material layer is between about 30% and about 70% of a thickness of the hard mask layer.

In further embodiments, a thickness of the material layer is between about 10% and about 35% of a thickness of the BARC.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate;
   forming a bottom anti-reflective coating (BARC) over the substrate;
   forming a hard mask layer over the BARC, wherein the forming of the hard mask layer produces a basic moiety;
   forming a first material layer over the hard mask layer, wherein the first material layer includes an acidic moiety such that the acidic moiety of the first material layer neutralizes the basic moiety produced by the forming of the hard mask layer upon forming of the first material layer over the hard mask layer;
   forming a photoresist layer over the first material layer;
   exposing the photoresist layer to a radiation source according to a pattern;
   developing the photoresist layer; and
   performing a first etching process to form the pattern in the first material layer and the hard mask layer but not in the substrate.

2. The method of claim 1, wherein the acidic moiety of the first material layer includes one of carboxylic acid or benzoic acid, and wherein the first material layer includes a polymer having the acidic moiety bonded to its backbone.

3. The method of claim 2, wherein the polymer of the first material layer further includes a lactone group bonded to its backbone.

4. The method of claim 1, further comprising exposing the photoresist layer to energy source, wherein the photoresist layer includes an acid-generating molecule responsive to the energy source.

5. The method of claim 1, wherein a thickness of the first material layer is between about 30% and 70% that of the hard mask layer.

6. A method, comprising:
   forming a bottom anti-reflective coating (BARC) over a substrate;
   forming a hard mask layer over the BARC;
   forming a material layer over the hard mask layer, wherein the material layer includes a first acid-generating molecule sensitive to radiation having a first wavelength;
   forming a photoresist layer over the material layer, wherein the photoresist layer includes a second acid-generating molecule sensitive to radiation having a second wavelength;
   performing a first exposure process, wherein the performing of the first exposure process is implemented using radiation of the first wavelength;
   performing a second exposure process, wherein the performing of the second exposure process is implemented using radiation of the second wavelength;
   developing the photoresist layer to form a pattern;
   performing a first etching process of the material layer and the hard mask layer using the photoresist layer as an etch mask; and
   performing a second etching process of the BARC using the hard mask layer as an etch mask.

7. The method of claim 6, wherein the forming of the hard mask layer produces a basic moiety.

8. The method of claim 6, wherein the performing of the first exposure process includes performing a flood exposure.

9. The method of claim 8, wherein the performing of the first exposure process produces a first acid moiety in the material layer but not in the photoresist layer.

10. The method of claim 6, wherein the forming of the material layer is implemented by a spin-coating process.

11. The method of claim 10, wherein a thickness of the material layer is between about 30% and about 70% of a thickness of the hard mask layer.

12. The method of claim 10, wherein a thickness of the material layer is between about 10% and about 35% of a thickness of the BARC.

13. A method comprising:
   forming a hard mask layer over a substrate;
   forming a material layer over the hard mask layer, wherein the material layer includes a first acid-generating molecule sensitive to radiation having a first wavelength;
   forming a photoresist layer over the material layer, wherein the photoresist layer includes a second acid-generating molecule sensitive to radiation having a second wavelength;
   performing a first exposure process, wherein the performing of the first exposure process is implemented using radiation of the first wavelength;
   performing a second exposure process, wherein the performing of the second exposure process is implemented using radiation of the second wavelength;
   developing the photoresist layer to form a pattern in at least the photoresist layer; and
   forming an anti-reflective coating layer over the substrate prior to the forming of the hard mask layer over the substrate.

14. The method of claim 13, wherein the developing of the photoresist layer to form the pattern includes removing portions of the photoresist layer exposed to the radiation having the first wavelength and the radiation having the second wavelength.

15. The method of claim 13, wherein the developing of the photoresist layer to form the pattern includes removing portions of the photoresist layer unexposed to the radiation having the first wavelength and the radiation having the second wavelength.

16. The method of claim 13, wherein the developing of the photoresist layer to form the pattern in at least the photoresist layer further includes developing of the material layer to form the pattern in the material layer.

17. The method of claim 13, wherein the performing of the first exposure process includes performing a flood exposure, and
   wherein the performing of the second exposure process includes an exposure process utilizing a photomask.

18. The method of claim 13, wherein the material layer includes a polymeric material.

19. The method of claim 13, wherein the first wavelength is different from the second wavelength.

20. The method of claim 5, wherein the thickness of the first material layer is between about 10% and about 35% that of the BARC.

* * * * *